United States Patent [19]

Howatt

[11] 4,079,272
[45] Mar. 14, 1978

[54] OPTICALLY ISOLATED INTERFACE CIRCUITS

[75] Inventor: John R. Howatt, Waltham, Mass.

[73] Assignee: The Charles Stark Draper Laboratory, Inc., Cambridge, Mass.

[21] Appl. No.: 672,416

[22] Filed: Mar. 31, 1976

[51] Int. Cl.² ............................................. H03K 17/00
[52] U.S. Cl. ................................... 307/311; 307/237; 307/DIG. 1; 307/317 R
[58] Field of Search ............ 307/311, DIG. 1, 235 E, 307/237, 291, 297, 317 R

[56] References Cited

U.S. PATENT DOCUMENTS

| 3,691,403 | 9/1972 | Newmeyer | 307/311 |
|---|---|---|---|
| 3,766,409 | 10/1973 | Shuey | 307/311 |
| 3,767,978 | 10/1973 | Wernli | 307/311 |
| 3,801,837 | 4/1974 | Pease et al. | 307/311 |
| 3,848,140 | 11/1974 | Guermeur et al. | 307/311 |

Primary Examiner—Stanley D. Miller, Jr.
Assistant Examiner—B. P. Davies
Attorney, Agent, or Firm—Robert F. O'Connell

[57] ABSTRACT

Circuitry for providing electrical isolation between an input signal source and other circuitry which utilizes such input signal. The isolation circuitry uses an optical coupling means comprising a light-emitting diode circuit and a photo-responsive element, the input signal being supplied by a bridge circuit which provides a unidirectional voltage from the input signal which is then applied to a normalizing, or limiting, circuit which converts the unidirectional voltage to a substantially constant value which is supplied to the light-emitting diode circuit. The circuit is responsive to an input signal which can be an AC signal or a DC signal of either polarity, such circuit having a high degree of noise survivability even in the presence of transient noise signals such as "showering arcs" having extremely high amplitudes.

9 Claims, 4 Drawing Figures

OPTICALLY ISOLATED INTERFACE CIRCUITS

INTRODUCTION

This invention relates generally to isolation devices and, more particularly, to optical isolator circuits for maintaining electrical isolation between input signal sources and logic, or other, circuitry which utilize such input signals.

BACKGROUND OF THE INVENTION

In many systems, such as control systems which use computers or other appropriate control logic, it is desirable to supply such control logic with input signals of various kinds for controlling various operations or for processing input data signals. In many applications it is desirable that the utilization device, i.e., the control logic circuitry, be electrically isolated from the source of the input signals which are being supplied thereto. One type of device which provides such isolation is an optical isolator wherein the input signal is converted to a light signal, as by a light-emitting diode (LED), which light light-emitting signal is thereupon received by a photoresponsive device, such as a high speed photodiode transistor pair. Transmission of the input signal in the form of a light signal provides appropriate electrical isolation between the input circuitry which supplies the LED and the output circuitry which is supplied from the photoresponsive device to the control logic.

Presently available optical isolator circuits are usually designed for very specific applications so as to accept input signals having particular characteristics, the design thereby being tailored to such characteristics. For example, certain isolators may be designed for accepting only AC signals, or for accepting only DC signals of a specified polarity and, in general, such design is usually responsive only to signals of a particular relatively narrow range of amplitude levels. Accordingly, such optical isolators are not generally available for widespread use in many different applications which may involve the acceptance of input signals of many different characteristics, i.e., AC signals or DC signals of either polarity, and signals having a wide dynamic range of amplitudes.

Even where such optical isolator circuitry is specifically designed for a particular use, such circuitry is subject to picking up undesirable noise signals of varying amplitudes which affect the output signal being supplied to the utilization device. A particular problem arises, for example, when extremely high amplitude noise signals are picked up by the isolator circuitry. For example, in machine tool control applications, the starting and stopping of motors which are used in the machine tool system produces extremely high amplitude oscillatory transient signls, commonly called "showering arc", sometimes as high as several thousand volts. The envelope of these signals tends to be several hundred microseconds long. Such transient signals are picked up by the input signal lines of the isolator from cables located in the general vicinity thereof. These transient noise signals normally have extremely wide bandwidths and the ability to filter them by conventional filter means is extremely difficult.

Moreover, even were the signals somehow to be filtered before being applied to the control logic circuitry at the output of the isolator device, the signals would still be present at the input circuitry to the LED. In such circumstances, while the overall system may be designed to achieve a relatively high degree of noise immunity (i.e., the output signal from the device has reduced noise levels), the input circuitry including the LED device will still be directly subject to the transient signal and the electric components used therein may be destroyed by the high amplitude transient signals. Hence, the circuitry, though having some noise immunity, often has low noise survivability to the application of such transients because the latter levels are so high that damage or destruction to the elements thereof occurs.

For example, certain present day isolator circuitry uses an LED and resistor which has a Zener diode connected in parallel therewith so as to provide a substantially constant voltage across the LED and resistor and, therefore, a substantially constant current through the LED. However, the Zener diode, apart from being costly, is subject to destruction by high amplitude transients of any polarity. Moreover, transients of negative polarity, even having relatively low amplitudes, can cause the Zener diode to be effectively destroyed by the occurrence thereof. Insofar as is known at present, no optical isolator circuitry is available which can adequately survive high transient noise signals which may occur in many applications nor do such presently available optical isolator circuits permit the acceptance of input signals over wide ranges of input amplitudes for both AC signals and DC signals of either polarity.

BRIEF SUMMARY OF THE INVENTION

This invention provides an optical isolator circuit which has a high degree of noise survivability even in the face of transient noise signals of extremely high amplitudes as discussed above. Furthermore, the circuit of the invention can accommodate signals of many different types (i.e., AC signals and DC signals of either polarity) over a wide range of input signal amplitude levels. Moreover, the system of the optical isolator of the invention can be utilized for many input signal sources without disrupting the operation thereof. For example, it can be used with many different electronic devices such as electronic sensors (e.g., proximity sensors) which require that no loading problems occur when the optical isolator is connected thereto.

In accordance with the invention, the input circuitry to a light-emitting diode utilizes a first input circuit section which, in a preferred embodiment, is in the form of a bridge circuit for providing a unidirectional voltage from the input signal. The unidirectional signal is then applied to a normalizing, or hard-limiting, circuit which converts the input voltage, which may vary over a wide range of amplitudes, to a substantially constant voltage which is then supplied to the LED and resistor to produce a relatively constant DC current therethrough.

The output of the LED is coupled to a photoresponsive device which is in turn coupled, in a preferred embodiment, to a Schmitt trigger gate circuit which further eliminates any transition noise as the signal changes state by using a fixed amount of hysteresis. The output of the Schmitt trigger circuit, in effect, shapes the input pulse from the photoresponsive device for supply to whatever control logic circuitry is being fed by the optical isolator in a utilization system. The input bridge circuit may preferably include a capacitor thereacross which, coupled with the input resistor, provides a filter circuit and permits the rectification of any AC signal which is applied to the input circuit.

In a preferred embodiment of the circuitry of the invention, the normalizing circuit is in the form of a plurality of conventional diodes arranged in series across a resistor and the light-emitting diode, the number of such diodes being selected to provide a voltage drop thereacross which is greater than that across the LED. Such diodes are selected to have a high back voltage capability.

DESCRIPTION OF THE INVENTION

The structure and operation of the optical isolator circuitry of the invention can be understood more readily with the help of the accompanying drawings wherein FIG. 1 shows a block diagram of an embodiment of the invention;

Figure 1:
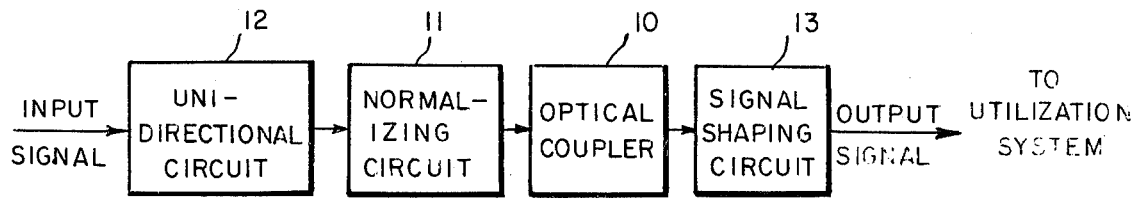
Figure 2:
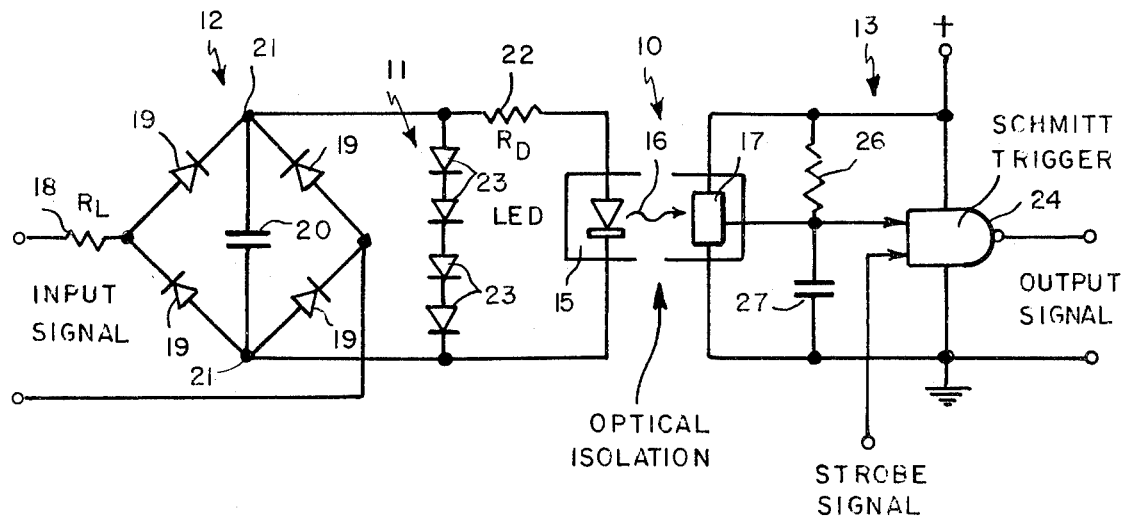
FIG. 2 shows a more detailed schematic diagram of an embodiment of the invention of FIG. 1.
Figure 3:
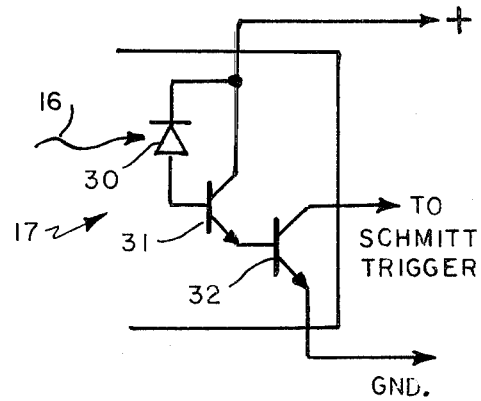
FIG. 3 shows a more detailed schematic diagram of a portion of the embodiment of FIG. 2.

As can be seen in FIGS. 1 and 2, an optical coupler device 10 which, in accordance with conventional optical isolation systems, comprises a photon-emitting source 15 which emits a light signal 16 which is representative of the input signal and a photoresponsive element 17 responsive thereto. Thus, electrical isolation occurs between the element 15 and the element 17. Elements 15 and 17, comprising a light-emitting diode device and a photoresponsive element, are available as a single packaged component sold, for example, as Model 5082-4370 by the HPA Division of Hewlett-Packard Company of Palo Alto, California. The photoresponsive element 17 of such package comprises a high speed photo-diode 30 coupled to a pair of amplifying transistors 31 and 32 as shown in FIG. 3. The optical coupler 10 provides the electrical isolation from the input signal thereto to the output signal therefrom by transmitting such signal in the form of light signal 16. As seen generally in FIG. 1, the input to the optical coupler 10 is supplied as an input signal from an appropriate source (not shown) which is fed to a unidirectional circuit 12 which supplies a unidirectional output voltage which is in turn supplied to a normalizing, or hard-limiting, circuit 11, the output of which is supplied as the input to the optical coupler 10. The output signal from optical coupler 10 may be fed in a preferred embodiment to an appropriate signal shaping circuit to produce an output signal for use by a utilization system. The latter, for example, may comprise appropriate control logic for controlling a machine in a production line, or the like. The overall signal channel of FIG. 1 from the input signal to the output signal may be one of a plurality of such channels used in an overall processing or control system, each channel handling a particular input command for supplying an output command signal to control logic of the utilization system.

In a system, such as a machine tool control system, which may include a large number of such channels, it is desirable that the optical isolation circuitry be interchangeable so that the same circuit can be produced on a mass basis and used in many different channels so as to be responsive to signals of varying characteristics supplied at the input thereto. Thus, the input signal may be an AC signal or a DC signal of either polarity. Moreover, the amplitude of the input signal may vary over a relatively wide range from a few volts to as high as 220 volts, or more. Moreover, the input signal may be from an appropriate electronics device, such as a sensing device, which, in order to operate properly, cannot be unduly overloaded. For example, the sensing device may be a proximity sensor which requires a relatively high input impedance for the optical isolation circuitry so that it is not excessively loaded thereby.

In accordance with a specific preferred embodiment of the invention, as shown in FIG. 2, the input signal is fed through an input load resistor 18 identified as $R_L$ to a unidirectional circuit 12 in the form of a bridge circuit comprising diodes 19. A capacitance 20 may be utilized across the diagonal output terminals 21, 21, as shown. The output voltage across the latter terminals is a unidirectional voltage. Thus, for a DC input signal of either polarity, such voltage will have the same polarity across terminals 21, 21. Moreover, for an AC input signal the R-C circuit comprising resistor 18 and capacitor 20 coupled with diodes 19 will effectively rectify the AC signal and provide a unidirectional voltage of the same polarity across such terminals.

Such voltage is supplied to the light-emitting diode 15 through diode resistance 22, identified as $R_D$. The voltage across the diode 15 and the diode resistance 22 is maintained at a substantially constant level by the normalizing, or hard-limiting, circuit 11 which in the embodiment shown in FIG. 2 comprises a plurality of series-connected diodes 23. The substantilly constant voltage thereupon effectively produced across diodes 23 provides a substantially constant current through light-emitting diode 15. The forward current through the diode 15 will remain at such substantially constant level independently of the dynamic range of the input signal which is supplied to the input circuit. The series-connected diodes 23 produce a relatively small change in forward voltage with current and can be selected to be relatively low cost and highly rugged elements. For example, such diodes and diodes 19 may be of the type sold as Model No. 1N5061, made and sold by the Semiconductor Products Department of General Electric Company, of Syracuse, N.Y., or by Texas Instruments Company of Dallas, Tex. The output from photoresponsive element 17 is coupled to a Schmitt trigger gate 24 which has a fixed amount of hysteresis. The latter characteristic tends to eliminate transition noise which may result when the signal changes state and further tends to reduce the overall noise of the output signal which is supplied to a utilization system. Such a Schmitt trigger may be, for example, in the form of an integrated circuit which can be purchased as Model No. 74132, made and sold by Texas Instruments Company of Dallas, Texas. The Schmitt trigger may be disabled at its input on command by an appropriate strobe signal applied to the disabled input thereof. In some applications the presence of large transient noise signals may be anticipated and the strobe signal can be applied to disable the Schmitt trigger circuit sufficiently prior to the generation of such transients so that none of the transient signal is supplied at the output signal terminal to the utilization system. However even where the output circuitry from the photoresponsive device through the Schmitt trigger is disabled, the elements of the input circuit will still be subject to the high voltage transient signal and must, therefore, be capable of surviving the application thereof.

The configuration shown in FIG. 2 can provide low input current to the light-emitting diode for voltages which can range as high as 220 volts AC. Thus, for example, the current can be held to a relatively constant value within a range from about 1 milliamp, to about 2 milliamps, over such range.

In some applications where only DC input signals are anticipated the capacitor 20 may be omitted from the circuit. An RC circuit utilizing resistors 26 and capacitor 27 may be utilized in the output signal shaping circuit 13 to provide some filtering or high frequency input noise. The capacitor is relatively small, for example, about 0.01 microfarads in order to prevent a burst of oscillation on the transition edges which is caused by the changing input impedance of the trigger input as it goes through threshold.

The number of diodes 23 is selected so that their total voltage drop is greater than the voltage drop of the light-emitting diode which is supplied by the voltage thereacross. For the light-emitting diodes specified above, for example, four diodes 23 are found to be adequate to provide the required substantially constant voltage supplied thereto. Such diodes and the diodes used in the bridge circuit are selected to have high back-voltage capability for negative transients and will, in the case of those selected, stand up to as high as 600 volts back-voltage each.

Figure 4:
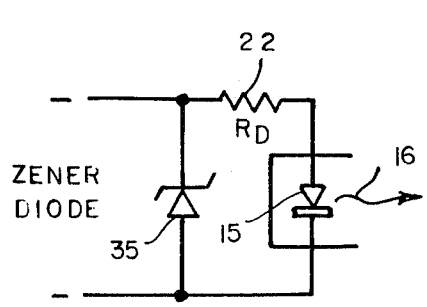
FIG. 4 shows a schematic diagram of an alternative embodiment of a portion of the invention.

In the configuration of FIG. 2 the stack of diodes 23 may be in some applications replaced with a Zener diode 35 as shown in the alternative embodiment of FIG. 4. The latter, however, for some applications may be too sensitive to input transients and also is a relatively high cost device and requires a relatively high bias current to operate at the appropriate part of its characteristic curve, which high current requirement results in a relatively large increase in the power dissipation of the input limiting resistance $R_L$ to the bridge circuit. Further, the Zener diode may be useful substantially only in applications where temperatures remain relatively low, that is, room temperature.

Thus, the overall system particularly in the embodiment shown in FIG. 2, provides a circuit which can utilize low cost readily available elements, particularly with respect to the diodes 23 and 19 which can be conventional silicon power diodes as mentioned above. The overall circuitry consumes substantially less power than previously used circuits and because of the low current and power requirements, the input resistance $R_L$ can be relatively higher so that the overall input impedance of the circuit is higher than that provided by prior art circuits. Moreover, unlike previously available isolation circuits, the circuitry of the invention can accept AC or DC signals of either polarity and can accept a relatively wide range of input voltages. Moreover, the elements are less subject to destruction due to large noise signals and the overall circuitry can survive high transient noise voltages of several thousands of volts, since the diode elements used therein can be selected to have higher peak reverse voltage ratings than the Zener diodes used in previously available isolator circuitry.

The overall design is extremely reliable and of minimal complexity and, because of its universality, identical isolator circuits in accordance therewith can be used for a plurality of different signal channels without costly redesign tailored to fit each type of input signal.

What is claimed is:

1. A circuit responsive to an input signal for providing an output signal which is electrically isolated therefrom, said circuit comprising
    means responsive to said input signal for providing a unidirectional signal having a predetermined polarity;
    a plurality of series-connected and forward-biased diode means responsive to said unidirectional signal for providing a d-c signal having said predetermined polarity and having a substantially constant amplitude; and
    coupling means responsive to said substantially constant amplitude d-c signal for providing a coupled output signal which is representative thereof and is electrically isolated therefrom, the number of said series-connected and forward-biased diode means being selected so as to provide a voltage drop thereacross which is greater than the voltage drop across said coupling means and a substantially constant current through said coupling means, said diode means further preventing the presence of substantially large voltage transient signals at said coupling means.

2. A circuit in accordance with claim 1 wherein said coupling means is an optical coupling means.

3. A circuit in accordance with claim 2 wherein said unidirectional signal providing means comprises a bridge circuit.

4. A circuit in accordance with claim 3 wherein said diode means are connected in parallel with said optical coupling means.

5. A circuit in accordance with claim 2 wherein said optical coupling means includes a light emitting diode responsive to said d-c signal for producing a light signal and a photo detector means responsive to said light signal for providing an electrical signal.

6. A circuit in accordance with claim 1 and further including capacitance means connected in parallel with said series-connected diode means.

7. A circuit in accordance with claim 1 and further including means responsive to said coupled output signal for shaping the waveform thereof.

8. A circuit in accordance with claim 7 wherein said waveform shaping means comprises a Schmitt trigger circuit.

9. A circuit in accordance with claim 8 wherein said Schmitt trigger circuit is adapted to be responsive to a strobe signal for disabling said Schmitt trigger when said strobe signal is present.

* * * * *